(12) United States Patent
Lee

(10) Patent No.: US 8,093,122 B2
(45) Date of Patent: Jan. 10, 2012

(54) METHOD FOR FABRICATING VERTICAL CHANNEL TRANSISTOR

(75) Inventor: Chun-Hee Lee, Gyeonggi-do (KR)

(73) Assignee: Hynix Semiconductor Inc., Bubal-eub, Ichon-si (KR)

( * ) Notice: Subject to any disclaimer, the term of this patent is extended or adjusted under 35 U.S.C. 154(b) by 680 days.

(21) Appl. No.: 12/163,257

(22) Filed: Jun. 27, 2008

(65) Prior Publication Data
US 2009/0163006 A1  Jun. 25, 2009

(30) Foreign Application Priority Data

Dec. 24, 2007  (KR) .................. 10-2007-0136440
May 26, 2008   (KR) .................. 10-2008-0048835

(51) Int. Cl.
*H01L 21/8238* (2006.01)

(52) U.S. Cl. ........ 438/209; 438/137; 438/138; 438/156; 438/173; 438/192; 438/206; 438/212; 438/268

(58) Field of Classification Search .................. 438/137, 438/138, 156, 173, 192, 206, 209, 212, 268
See application file for complete search history.

(56) References Cited

FOREIGN PATENT DOCUMENTS

| KR | 1020040057698 |    | 7/2004 |
|----|---------------|----|--------|
| KR | 10-0497610    |    | 6/2005 |
| KR | 100780598 B1  | *  | 5/2006 |
| KR | 100780598     |    | 11/2007 |

OTHER PUBLICATIONS

Korean Notice of Allowance for application No. 10-2008-0048835, Pub Date Dec. 15, 2010.

* cited by examiner

*Primary Examiner* — N Drew Richards
*Assistant Examiner* — Jae Lee
(74) *Attorney, Agent, or Firm* — Lowe Hauptman Ham & Berner LLP

(57) ABSTRACT

A method for fabricating a vertical channel transistor includes forming a structure including a plurality of trimmed pillar patterns, forming a conductive layer for a gate electrode including a seam over a resultant structure with the pillar patterns, performing an etch-back process until the seam is exposed, and forming a gate electrode by etching the etch-backed conductive layer.

15 Claims, 5 Drawing Sheets

METHOD FOR FABRICATING VERTICAL CHANNEL TRANSISTOR

CROSS-REFERENCE TO RELATED APPLICATIONS

The present application is based on, and claims priority from, Korean patent application number 2007-0136440, filed on Dec. 24, 2007, the disclosure of which is hereby incorporated by reference herein its entirety.

BACKGROUND OF THE INVENTION

The present invention relates to a method for fabricating a semiconductor device, and more particularly, to a method for fabricating a vertical channel transistor.

As semiconductor devices have become highly integrated, methods for fabricating semiconductor devices have reached the limitation in many aspects. When a channel length decreases, the semiconductor devices can be highly integrated. However, short channel effects such as a drain induces barrier lowering, a hot carrier effect, and a punch through are caused.

To prevent the short channel effect, various methods for increasing the channel length, e.g., etch of the silicon in a channel region, are introduced.

However, as an integration density of a semiconductor memory device, particularly, a Dynamic Random Access Memory (DRAM), approaches giga bits, fabrication of a smaller transistor is required. In other words, gigabit-class DRAM transistors require a device dimension under $4F^2$ (where F is a minimum feature size) or less. Therefore, an existing planar MOS transistor structure having a gate electrode over a substrate and junction regions on both sides of the gate electrode hardly satisfy a required device dimension even though the channel length is scaled.

To overcome the above limitations, a vertical channel transistor has been introduced.

FIGS. 1A to 1C are cross-sectional views illustrating a method for fabricating a typical vertical channel transistor.

Referring to FIG. 1A, a substrate 11 is etched to a certain depth using a hard mask pattern 12 as an etch barrier. Thus, a first pillar 13 is formed. A capping layer 14 is formed on sidewalls of the first pillar 13. The substrate 11 under the first pillar 13 is etched more using the hard mask pattern 12 as an etch barrier. Thus, a second pillar 15 is formed.

Referring to FIG. 1B, an isotropic dry etch process is performed on sidewalls of the second pillar 15. Thus, a second pillar pattern 15A is formed.

Referring to FIG. 1C, a gate insulation layer 16 is formed over a surface of the second pillar pattern 15A and substrate 11. A gate electrode 17 surrounding external walls of the second pillar pattern 15A is formed. Material for the gate electrode may include polysilicon.

FIGS. 2A and 2B illustrate a method for fabricating a typical gate electrode 17.

Referring to FIG. 2A, polysilicon 17 is deposited in a resultant structure including the second pillar pattern 15A. The resultant structure including the second pillar pattern 15A has a narrow opening and a wide bottom. Thus, a seam 22 is generated during the deposition of the polysilicon 17.

Referring to FIG. 2B, an isotropic etch process is performed on the polysilicon 17 including the seam 22. Thus, the polysilicon 17 remains on sidewalls of the second pillar pattern 15A.

Since the seam 22 is generated when the polysilicon 17 is deposited, a gate oxide layer 16 and the substrate below the seam 22 may be attacked when the polysilicon 17 is etched. Thus, a punch 24 may be generated.

The punch 24 may cause a deposition uniformity defect when an insulation layer is deposited during a formation of a Buried Bit Line (BBL), or etch residuals from the punch 24 may function as an etch barrier when the BBL is etched.

SUMMARY OF THE INVENTION

Embodiments of the present invention are directed to providing a method for fabricating a vertical channel transistor.

In accordance with an aspect of the present invention, there is provided a method for fabricating a vertical channel transistor. The method includes forming a structure including a plurality of trimmed pillar patterns, forming a conductive layer for a gate electrode including a seam over a resultant structure with the pillar patterns, performing an etch-back process until the seam is exposed, and forming a gate electrode by etching the etch-backed conductive layer.

In accordance with another aspect of the present invention, there is provided a method for fabricating a vertical channel transistor. The method includes forming a structure including a plurality of trimmed pillar patterns and a gate insulation layer, forming a first conductive layer for a gate electrode by etching-back the conductive layer until the seam is exposed, performing an isotropic etch process on the first conductive pattern to form a second conductive pattern to thereby decrease a depth uniformity, and etching the second conductive pattern until the gate insulation layer is exposed to form a gate electrode.

DESCRIPTION OF SPECIFIC EMBODIMENTS

Embodiments of the present invention relate to a method for fabricating a method for fabricating a vertical channel transistor.

Embodiments of the present invention relate to a method for fabricating a method for fabricating a vertical channel transistor.

FIGS. 3A to 3D are cross-sectional views illustrating a method for fabricating a vertical channel transistor in accordance with an embodiment of the present invention.

Figure 1A:
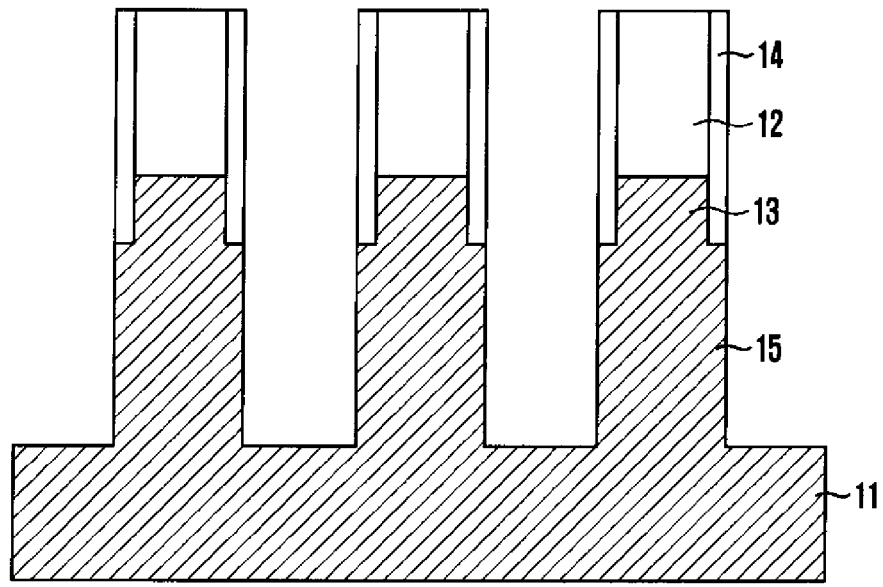
FIGS. 1A to 1C are cross-sectional views illustrating a method for fabricating a vertical channel transistor.
Figure 1B:
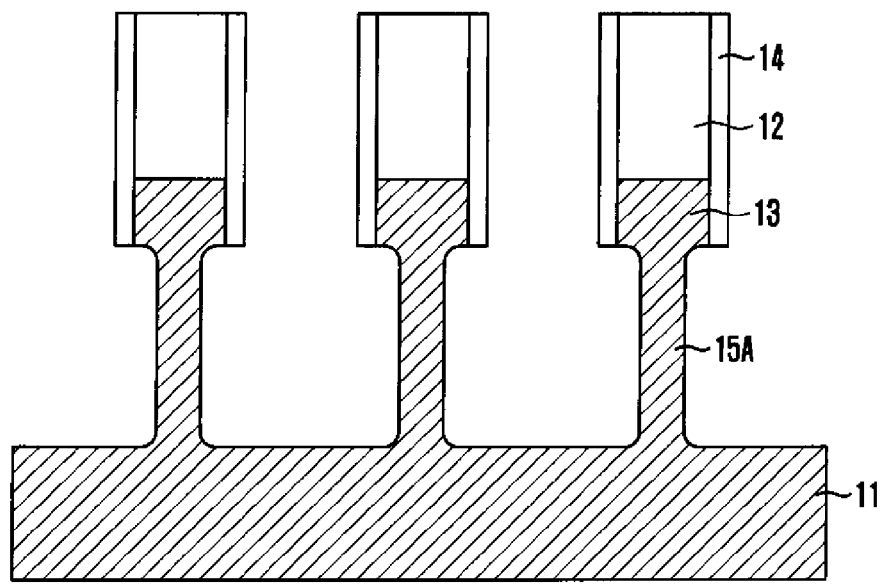
Figure 1C:
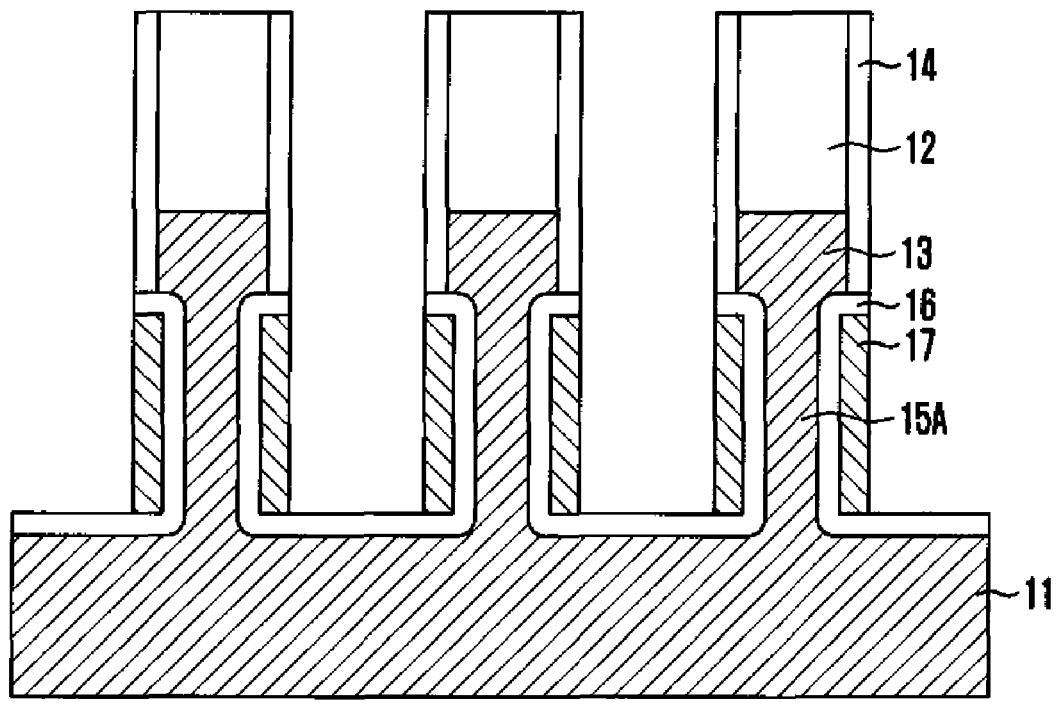
Figure 2A:
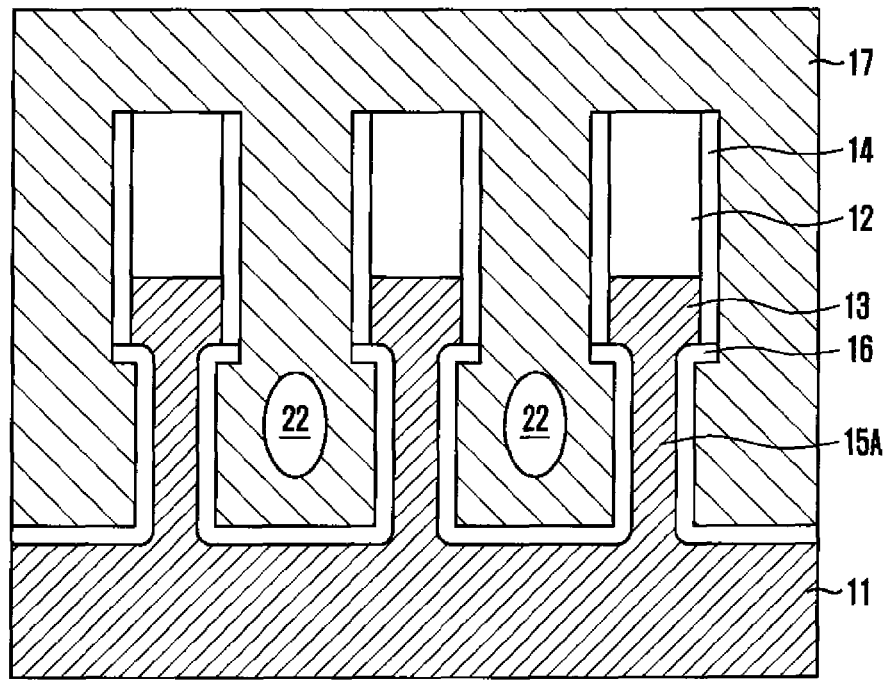
FIGS. 2A and 2B illustrate a method for fabricating a typical gate electrode 17.
Figure 2B:
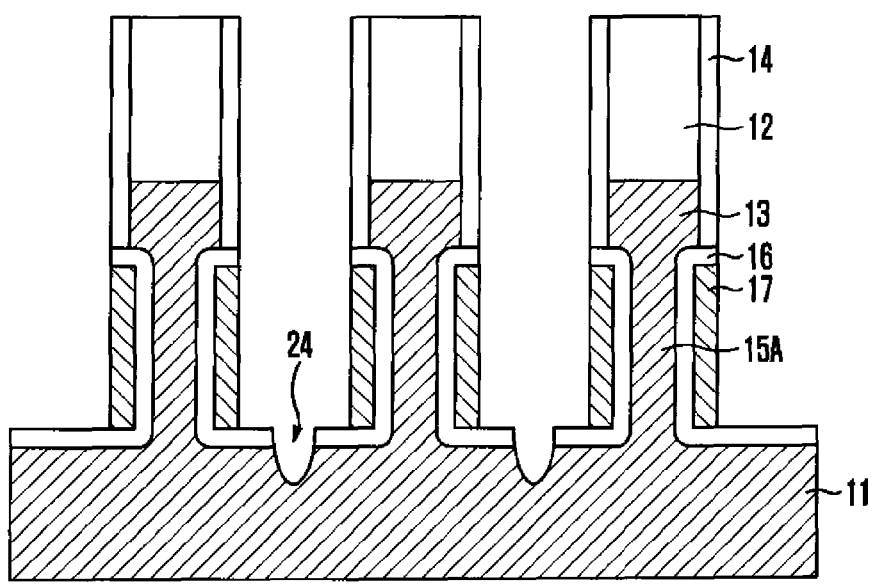
Figure 3A:
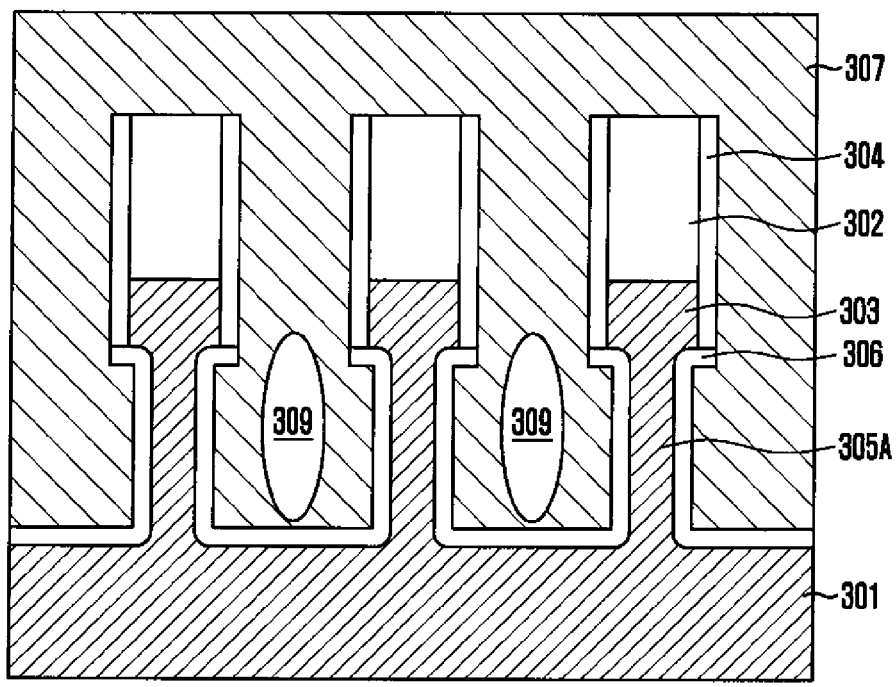
FIGS. 3A to 3D are cross-sectional views illustrating a method for fabricating a vertical channel transistor in accordance with an embodiment of the present invention.

Referring to FIG. 3A, a conductive layer 307 for a gate electrode is deposited on a resultant structure including a first pillar pattern 303 and a second pillar pattern 305A. The first pillar pattern 303 and the second pillar pattern 305A constitute a pillar pattern. The resultant structure includes a plurality of pillar patterns. Herein, the conductive layer 307 cannot be sufficiently filled between the pillar patterns because of a structural shape. Thus, a seam 309 is generated between the pillars. The conductive layer 307 may include polysilicon.

A substrate 301 is etched using a hard mask pattern 302 as an etch barrier. Thus, the first pillar 303 is formed. A capping layer 304 is formed on sidewalls of the first pillar pattern 303. Then, the substrate 301 below the first pillar 303 is further etched using the capping layer 304 and hard mask pattern 302 as an etch barrier to form the second pillar. An isotropic dry etch process is performed on sidewalls of the second pillar to form the second pillar pattern 305A with a decreased width. A gate insulation layer 306 is formed over a surface of the second pillar pattern 305A and the substrate 301. The conductive layer 307 is formed over a resultant structure.

Figure 3B:
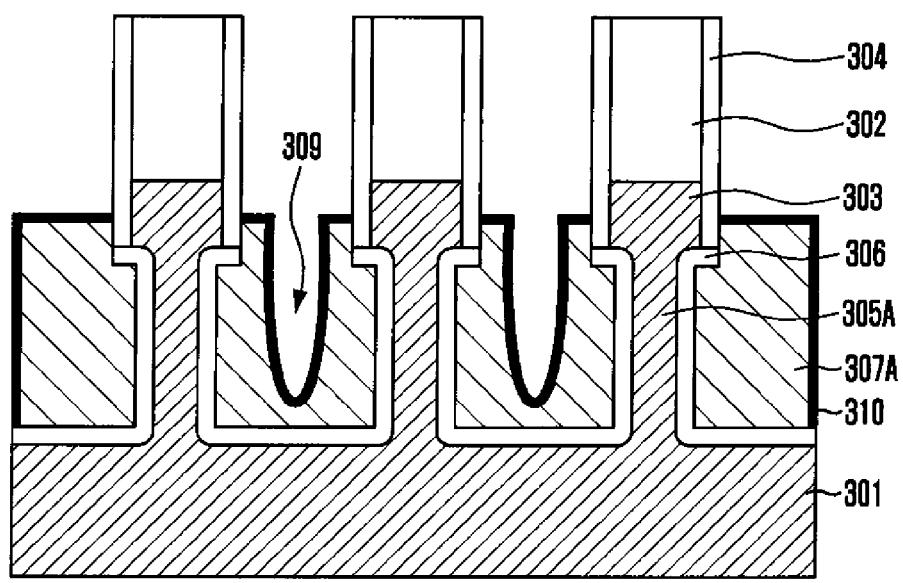

Referring to FIG. 3B, the conductive layer 307 is etched back until the seam 309 is exposed. Thus, a first conductive pattern 307A is formed.

When the conductive layer 307 includes the polysilicon, the etch-back process is performed through a three-staged process. The polysilicon deposited before the etch-back process may be planarized by a Chemical Mechanical Polishing (CMO) process.

In a first stage, pressure of approximately 5 mT to approximately 10 mT, source power of approximately 200 W to approximately 500 W, DC voltage of approximately 50 V to approximately 200 V, and tetrafluoromethane ($CF_4$) gas of approximately 30 sccm to approximately 200 sccm may be applied. In the first stage, an oxide layer, i.e., a native oxide layer, formed over the polysilicon is removed.

In a second stage, pressure of approximately 5 mT to approximately 10 mT, source power of approximately 200 W to approximately 1,000 W, DC voltage of approximately 50 V to approximately 100 V, and chlorine ($Cl_4$) gas of approximately 30 sccm to approximately 200 sccm may be applied. A tetrachlorosilane ($SiCl_4$), i.e., byproduct of $Cl_2$—polysilicon reaction, peak increases and then, when the hard mask pattern 302 is exposed, the $SiCl_4$ peak decreases. Thus, by monitoring the $SiCl_4$ peak, an etch end point may be predicted.

In a third stage, pressure of approximately 5 mT to approximately 15 mT, source power of approximately 200 W to approximately 500 W, DC voltage of 0 V, helium (He) gas of approximately 50 sccm to approximately 200 sccm, and sulfur hexafluoride (SF6) gas of approximately 10 sccm to approximately 100 sccm may be applied. In the third stage, the polysilicon layer has a higher etch rate than the oxide layer (not shown, top portion of the hard mask pattern) and the etch process is performed until the seam is exposed. Furthermore, in the third stage, since the etch process does not require DC voltage and the polysilicon layer has a higher etch rate than the oxide layer, the polysilicon surrounding the capping layer 304 is completely removed.

Further, a buffer layer 310 is formed. The buffer layer 310 buffs an attack to a bottom portion of the seam during a subsequent process. That is, during the subsequent process, the gate insulation layer 306 may not exposed or attacked.

The buffer layer 310 may be an oxide nitride layer formed through a plasma oxidation and nitration process to have a thickness of approximately 10 Å to approximately 100 Å. A plasma treatment for forming the buffer layer 310 may be performed using an etch-back apparatus by In-Situ. The etch-back process is performed just before the plasma treatment.

The plasma treatment provides oxygen ($O_2$) gas, nitrogen ($N_2$) gas, or nitrous oxide ($N_2O$) gas into the etch-back apparatus and controls RF power to form a silicon oxynitride (SiON) layer over a surface of the polysilicon layer.

Figure 3C:
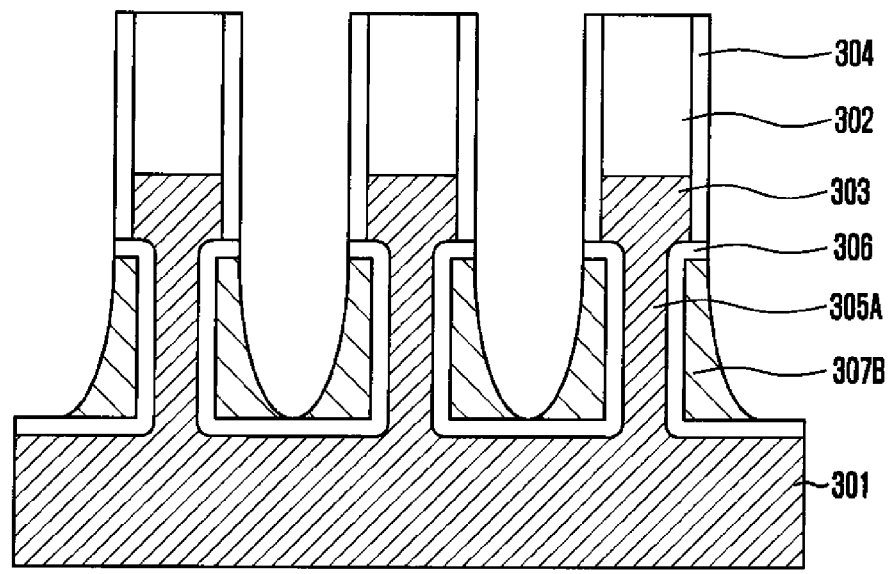

Referring to FIG. 3C, the isotropic etch process is performed on the buffer layer 310 and the first conductive pattern 307A just before the gate insulation layer 306 is exposed. Thus, a second conductive pattern 307B is formed. During the isotropic etch process, a top portion of the first conductive pattern 307A is etched further to decrease an etch depth uniformity. The isotropic etch process applies pressure of approximately 30 mT to approximately 100 mT, source power of approximately 200 W to approximately 500 W, DC voltage of 0 V to approximately 100 V, helium (He) gas of approximately 5 sccm to approximately 300 sccm, hydrogen bromide (HBr) gas of approximately 50 sccm to approximately 300 sccm, and $SF_6$ gas of approximately 10 sccm to approximately 100 sccm. In both of the above two processes, the polysilicon layer has a higher etch rate than the oxide layer. Thus, it is possible to decrease the isotropic etch depth of the polysilicon by adjusting the DC voltage.

Figure 3D:
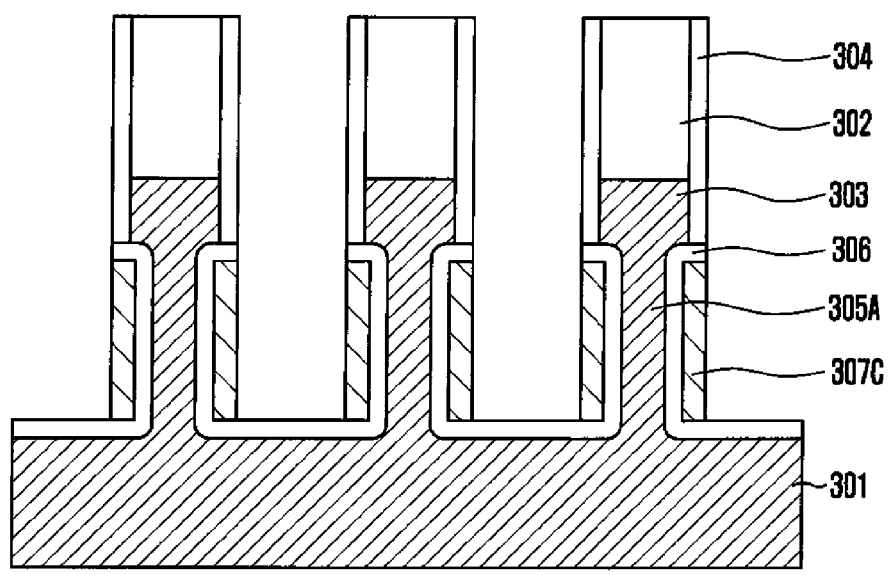

Referring to FIG. 3D, a second conductive pattern 307B is etched. In this etch process, the second conductive pattern 307B has a higher etch rate than the gate insulation layer 306 (generally, the oxide layer). Thus, a third conductive pattern 307C is formed. The third conductive pattern 307C is a gate electrode pattern. In this etch process, pressure of approximately 30 mT to approximately 100 mT, source power of approximately 200 W to approximately 500 W, DC voltage of 50 V to approximately 200 V, He gas of approximately 50 sccm to approximately 300 sccm, HBr gas of approximately 50 sccm to approximately 300 sccm, and $O_2$ gas of approximately 4 sccm to approximately 10 sccm may be applied.

In this embodiment, when a seam is generated during a formation process of a vertical channel transistor, an etch-back process is performed until the seam is exposed and then an etch process is performed to form a gate electrode pattern. Thus, it is possible to prevent an attack on the gate oxide layer and substrate. Furthermore, a subsequent BBL process margin increases.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a vertical channel transistor, the method comprising:
    forming a structure including a plurality of trimmed pillar patterns;
    forming a conductive layer for a gate electrode including a seam over a resultant structure with the pillar patterns;
    performing an etch-back process on the conductive layer until the seam is exposed;
    forming a buffer layer over the etch-backed conductive layer; and
    forming the gate electrode by etching the etch-backed conductive layer.

2. The method of claim 1, wherein the buffer layer includes a silicon oxynitride (SiON) layer formed through a plasma oxidation and nitration process.

3. The method of claim 1, wherein the forming of the structure comprises:
    etching a substrate by a certain depth using a hard mask pattern as an etch barrier to form a first pillar;
    forming a capping layer on sidewalls of the first pillar;
    etching the substrate using the capping layer and hard mask pattern as an etch barrier to form a second pillar; and
    performing an isotropic etch process on sidewalls of the second pillar to form a second pillar pattern.

4. The method of claim 3, wherein the etch-back process comprises:
    removing a native oxide layer formed over the conductive layer using a first process;
    etching the conductive layer until the hard mask pattern is exposed using a second process; and
    etching the conductive layer until the seam is exposed using a third process.

5. The method of claim 4, wherein the third process is performed without a DC voltage.

6. The method of claim 1, wherein the conductive layer includes polysilicon.

7. A method for fabricating a vertical channel transistor, the method comprising:
forming a structure including a plurality of trimmed pillar patterns and a gate insulation layer;
forming a first conductive pattern for a gate electrode by etching-back a conductive layer including a seam until the seam is exposed;
performing an isotropic etch process on the first conductive pattern to form a second conductive pattern to thereby decrease a depth uniformity; and
etching the second conductive pattern until the gate insulation layer is exposed to form the gate electrode.

8. The method of claim 7, further comprising:
forming a buffer layer over the first conductive pattern, after forming the first conductive pattern.

9. The method of claim 8, wherein the buffer layer includes a SiON layer formed through a plasma oxidation and nitration process.

10. The method of claim 9, wherein the plasma oxidation and nitration process is performed in an etch-back apparatus for the etch-back process by In-situ.

11. The method of claim 7, wherein the forming of the structure comprises:
etching a substrate by a certain depth using a hard mask pattern as an etch barrier to form a first pillar;
forming a capping layer on sidewalls of the first pillar;
etching the substrate using the hard mask pattern as an etch barrier to form a second pillar; and
performing an isotropic etch process on sidewalls of the second pillar to form a second pillar pattern.

12. The method of claim 11, wherein the etch-back process comprises:
removing a native oxide layer formed over the conductive layer through a first process;
etching the conductive layer until the hard mask pattern is exposed through a second process; and
etching the conductive layer until the seam is exposed using a third process.

13. The method of claim 12, wherein the third process is performed without a DC voltage.

14. The method of claim 8, wherein the buffer layer is formed to have a thickness of approximately 10 Å to approximately 100 Å.

15. The method of claim 7, wherein the conductive layer includes polysilicon.

* * * * *